United States Patent
Ma

(10) Patent No.: US 8,947,144 B2
(45) Date of Patent: Feb. 3, 2015

(54) APPARATUSES AND METHODS FOR DUTY CYCLE ADJUSTMENT

(71) Applicant: Micron Technology, Inc., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/920,852

(22) Filed: Jun. 18, 2013

(65) Prior Publication Data

US 2014/0368244 A1 Dec. 18, 2014

(51) Int. Cl.
- *H03K 3/017* (2006.01)
- *H03K 5/04* (2006.01)
- *H03K 7/08* (2006.01)
- *H03K 3/012* (2006.01)

(52) U.S. Cl.
CPC ................................. *H03K 3/012* (2013.01)
USPC ........................... 327/175; 327/170; 327/172

(58) Field of Classification Search
CPC ....... H03K 5/1565; H03K 7/08; H03K 3/017; H03K 5/151
USPC .................................................. 327/170, 175
See application file for complete search history.

(56) References Cited

U.S. PATENT DOCUMENTS

| | | | |
|---|---|---|---|
| 6,952,123 B2 | 10/2005 | Kizer et al. | |
| 7,078,949 B2 | 7/2006 | Kim et al. | |
| 7,176,734 B2 | 2/2007 | Park | |
| 7,884,659 B2 | 2/2011 | Jang et al. | |
| 7,961,017 B2 | 6/2011 | Lee | |
| 8,106,694 B2 | 1/2012 | Kim | |
| 8,149,034 B2 | 4/2012 | Gomm | |
| 2003/0179027 A1 | 9/2003 | Kizer et al. | |
| 2003/0218486 A1 | 11/2003 | Kwak | |
| 2004/0189363 A1* | 9/2004 | Takano | 327/175 |
| 2007/0147564 A1 | 6/2007 | Fan et al. | |
| 2008/0063125 A1 | 3/2008 | Chatwin | |
| 2010/0164571 A1 | 7/2010 | Jang et al. | |
| 2014/0002155 A1 | 1/2014 | Park et al. | |
| 2014/0253198 A1 | 9/2014 | Ma | |

* cited by examiner

*Primary Examiner* — John Poos
(74) *Attorney, Agent, or Firm* — Dorsey & Whitney LLP

(57) ABSTRACT

Apparatuses and methods for duty cycle adjustment are disclosed herein. An example apparatus may include a node, a phase mixer, and a duty cycle adjuster circuit. The phase mixer may have a first step duty cycle response and may be configured to provide a first output signal to the node in accordance with the first step duty cycle response. The duty cycle adjuster circuit may have a second step duty cycle response complementary to the first step duty cycle response and may be configured to provide a second signal to the node in accordance with the second step duty cycle response.

28 Claims, 5 Drawing Sheets

APPARATUSES AND METHODS FOR DUTY CYCLE ADJUSTMENT

TECHNICAL FIELD

Embodiments of the disclosure relate generally to phase mixers, and more particularly, in one or more of the illustrated embodiments, to duty cycle adjustment of phase mixer output signals.

BACKGROUND

Phase mixers are used for their ability to perform high resolution signal conversion. For example, a two-signal input phase mixer can provide an output signal generated from two input signals having different phases. The resulting output signal has a phase between the phases of the two input signals. Phase mixers are not without drawbacks, however. Phase mixers suffer from trade-offs between step size linearity and step duty cycle variation, as well as mismatches between the impact of each input signal on output non-linearity.

In particular, in some instances, step duty cycle non-linearity may be corrected by adjusting driver sizes (e.g., P/N ratios) and/or by changing step sequences of a phase mixer directly. These approaches, however, are not only specific to each phase mixer design, and therefore must be tailored for each phase mixer design, but can substantially increase circuit complexity or size and/or increase power consumption.

DETAILED DESCRIPTION

Apparatuses and methods for duty cycle adjustment are disclosed herein. In accordance with one or more described embodiments, duty cycle variation of a first signal may be reduced by providing a second signal with a matched duty cycle variation. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. Furthermore, the drawings provided herein are not necessarily drawn to scale, including the thicknesses of the various layers relative to one another. Also, relative and directional references (e.g., above, below, etc.) are given by way of example to aid the reader's understanding of the particular embodiments described herein, and should not be read as requirements or limitations unless specifically set forth in the claims.

Figure 1:
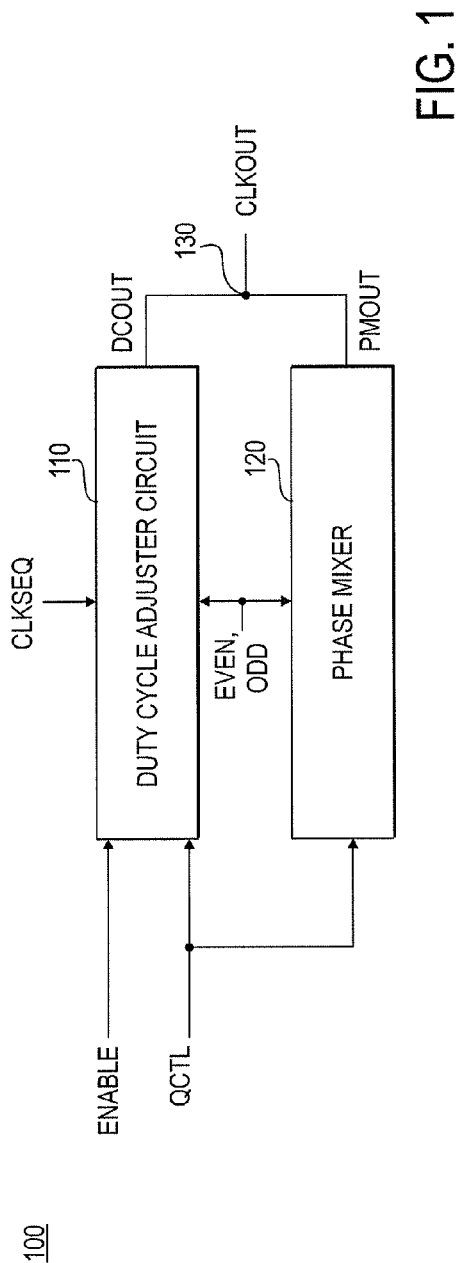
FIG. 1 is a block diagram of an apparatus according to an embodiment of the present invention.

FIG. 1 is a block diagram of an apparatus 100 according to an embodiment of the present invention. The apparatus 100 may include a duty cycle adjuster circuit 110 and a phase mixer 120.

The phase mixer 120 may comprise any phase mixer known in the art, now or in the future, and may be configured to receive clock signals EVEN, ODD. The clock signals EVEN, ODD may be provided by a controller, such as a memory controller (not shown in FIG. 1). The phase mixer 120 may be configured to provide a PMOUT output signal to a node 130, based, at least in part, on the clock signals EVEN, ODD. By way of example, the phase mixer 120 may provide a PMOUT output signal having a phase between the respective phases of the clock signals EVEN, ODD. Providing the PMOUT output signal in this manner may be referred to as "mixing" the clock signals EVEN, ODD.

The phase mixer 120 may be configured to provide the PMOUT output signal based, at least in part, on a control word QCTL. The control word QCTL may comprise an analog signal or a digital signal, and may indicate one of a plurality of phases between the phases of the clock signals EVEN, ODD. In embodiments in which the control word QCTL comprises a digital signal, the number of bits of the control word QCTL may determine the resolution by which the phase may be indicated. Briefly, the phase mixer 120 may be configured to receive the control word QCTL and mix the EVEN, ODD clock signals to provide the PMOUT output signal at a phase indicated by the control word QCTL.

In at least one embodiment, the phase mixer 120 may operate according to a particular step duty cycle response. By way of example, as the phase of the PMOUT output signal is adjusted, for instance by adjusting the control word QCTL as described, the duty cycle of PMOUT may adjust as well and in accordance with the step duty cycle response of the phase mixer 120. Moreover, the step duty cycle response of the phase mixer 120 may be non-linear. Accordingly, each adjustment of the phase of PMOUT may not result in a same change in duty cycle. For example, incrementing the control word QCTL to increment the phase of PMOUT from a first phase to a second phase may result in adjusting the duty cycle a first amount. Incrementing the control word QCTL to increment the phase of PMOUT from the second phase to a third phase may result in adjusting the duty cycle a second amount different than the first amount. In at least one embodiment, if the phase of PMOUT is closer to the phase of the one of the clock signals (e.g., EVEN clock signal), each adjustment made to the phase of PMOUT may result in relatively larger changes in duty cycle, and if the phase of PMOUT is closer to the phase of the other clock signal (e.g., ODD clock signal), each adjustment made to the PMOUT may result in relatively smaller changes in duty cycle. In other embodiments, the phase mixer 120 may have any other step duty cycle response. The step duty cycle response may be based on the design of the phase mixer 120 (e.g., driver sizes).

The duty cycle adjuster circuit 110 may be configured to receive the clock signals EVEN, ODD, and provide a DCOUT output signal to the node 130 based, at least in part, on the clock signals EVEN, ODD. The duty cycle adjuster circuit 110 may further receive the control word QCTL and/or the clock sequence signal CLKSEQ. As described, the control word QCTL may indicate a phase between the clock signals EVEN, ODD. The clock sequence signal CLKSEQ may indicate which of the clock signals EVEN, ODD is leading (e.g., which of the clock signals EVEN, ODD has an earlier phase).

The duty cycle adjuster 110 may be configured to provide the DCOUT output signal based, at least in part, on the control word QCTL and/or the clock sequence signal CLKSEQ, as described below.

In at least one embodiment, the duty cycle adjuster circuit 110 may further be configured to receive a control signal ENABLE, and may operate responsive to an asserted ENABLE control signal. In this manner, the duty cycle adjuster circuit 110 may be enabled and disabled for operation. In some embodiments, the ENABLE control signal may be based, at least in part, on duty cycle variation of the PMOUT output signal. By way of example, in at least one example, the ENABLE control signal may be asserted when duty cycle variation of the PMOUT output signal exceeds a particular threshold.

In an example operation, the duty cycle adjuster circuit 110 and the phase mixer 120 may each receive the clock signals EVEN, ODD and the control word QCTL. Based, at least in part, on the control word QCTL, each of the duty cycle adjuster circuit 110 and the phase mixer 120 may provide the DCOUT and PMOUT output signals to the node 130, respectively, the output signals DCOUT and PMOUT may be combined at the node 130 to provide a CLKOUT output signal.

As described, the phase mixer 120 may operate according to a particular step duty cycle response, which may result in duty cycle variation of the PMOUT output signal as the phase of PMOUT is adjusted. In at least one embodiment, the duty cycle adjuster circuit 110 may operate according to a step duty cycle response that is matched to the step duty cycle response of the phase mixer 120. Because the duty cycle adjuster circuit 110 may have a matched step duty cycle response, the DCOUT output signal may have duty cycle variation that is matched to the duty cycle variation of the PMOUT output signal. In this manner, the duty cycle variation of the DCOUT output signal may complement the duty cycle variation of the PMOUT output signal. As a result, combining the DCOUT and PMOUT output signals may result in the CLKOUT output signal having relatively low duty cycle variation. In at least one embodiment, the duty cycle adjuster circuit 110 may be designed to have a particular step duty cycle response, such as one that matches the step duty cycle response of the phase mixer 120. In other embodiments, the duty cycle adjuster circuit 110 may be configured to determine a step duty cycle response of the phase mixer 120 and operate with a step duty cycle response matching the determined step duty cycle response of the phase mixer 120.

By way of example, if the duty cycle of the PMOUT output signal increases, the duty cycle of the DCOUT output signal may decrease. Conversely, if the duty cycle of the PMOUT output signal decreases, the duty cycle of the DCOUT output signal may increase. By adjusting the duty cycle of the DCOUT output signal in this manner, the duty cycle of the CLKOUT output signal may remain relatively constant despite duty cycle variation of the PMOUT output signal. In some embodiments, the duty cycle variations of the PMOUT output signal and the DCOUT output signal may be matched such that the duty cycle variations are complementary (e.g., duty cycle variations are substantially mirrored). In other embodiments, the duty cycle variations may be matched such that the amount of duty cycle variation of each signal differs, but the duty cycle variation of the CLKOUT output signal is reduced relative to the duty cycle variation of the PMOUT output signal. In this manner, the duty cycle adjuster circuit 110 may be implemented using a variety of step duty cycle responses to achieve a reduced duty cycle variation of the CLKOUT output signal.

Figure 2:
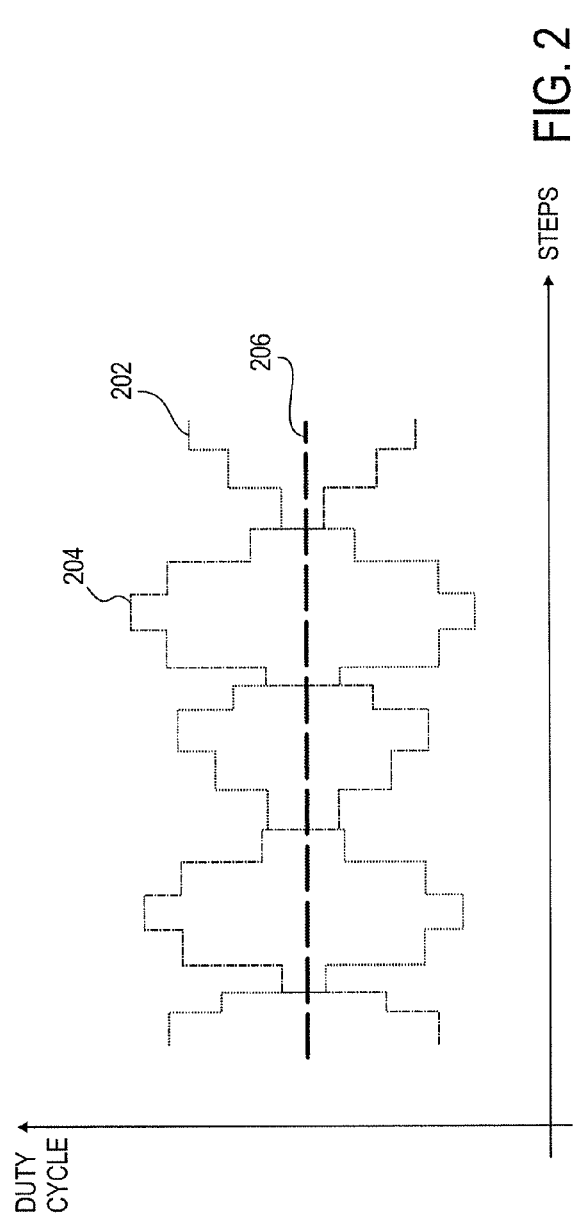
FIG. 2 is a graph illustrating example signal duty cycle responses according to an embodiment of the present invention.

With reference to FIG. 2, example step duty cycle responses 202, 204, 206 are illustrated. The step duty cycle response 202 may comprise a step duty cycle response for the DCOUT output signal, the step duty cycle response 204 may comprise a step duty cycle response for the PMOUT output signal, and the step duty cycle response 206 may comprise a step duty cycle response for the CLKOUT output signal. FIG. 2 illustrates that adjustments (e.g., "steps") of the phase of the DCOUT output signal may not result in a same change in duty cycle of the DCOUNT and that adjustments of the phase of the PMOUT output signal may not result in a same change in duty cycle of the PMOUT signal. As can be seen from FIG. 2, the step duty cycle response 202 may complement (e.g., inversely mirror) the step duty cycle response 204 as the phase of the PMOUT output signal is adjusted. As a result, the step duty cycle response 206 may be relatively constant, reflecting relatively low duty cycle variation of the CLKOUT output signal.

Figure 3:
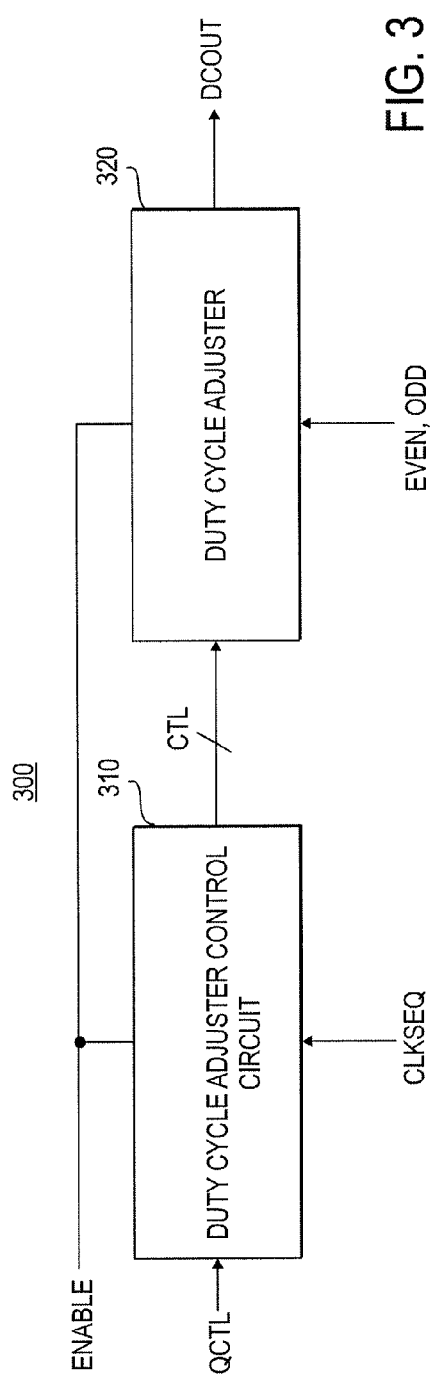
FIG. 3 is a block diagram of a duty cycle adjuster circuit according to an embodiment of the present invention.

FIG. 3 is a block diagram of a duty cycle adjuster circuit 300 according to an embodiment of the present invention. The duty cycle adjuster circuit 300 may be used to implement the duty cycle adjuster circuit 110 of FIG. 1. The duty cycle adjuster circuit 300 may include a duty cycle adjuster control circuit 310 and a duty cycle adjuster 320.

The duty cycle adjuster control circuit 310 may be configured to receive the control word QCTL and the clock sequence signal CLKSEQ and may be configured to provide a plurality of control signals CTL based, at least in part on the control word QCTL and the clock sequence signal CLKSEQ.

The duty cycle adjuster 320 may be coupled to the duty cycle adjuster control circuit 310 and configured to receive the plurality of control signals CTL. The duty cycle adjuster 320 may further be configured to receive the clock signals EVEN, ODD. Based, at least in part, on the plurality of control signals CTL and the clock signals EVEN, ODD, the duty cycle adjuster 320 may provide the DCOUT output signal. As described, the DCOUT output signal may have duty cycle variation complementing duty cycle variation of the PMOUT output signal provided by the phase mixer 120 of FIG. 1. The duty cycle adjuster control circuit 310 and the duty cycle adjuster 320 may further be configured to receive an ENABLE control signal. As described above, operation of each of the duty cycle adjuster control circuit 310 and the duty cycle adjuster 320 may be based, at least in part, on the ENABLE control signal.

Figure 4:
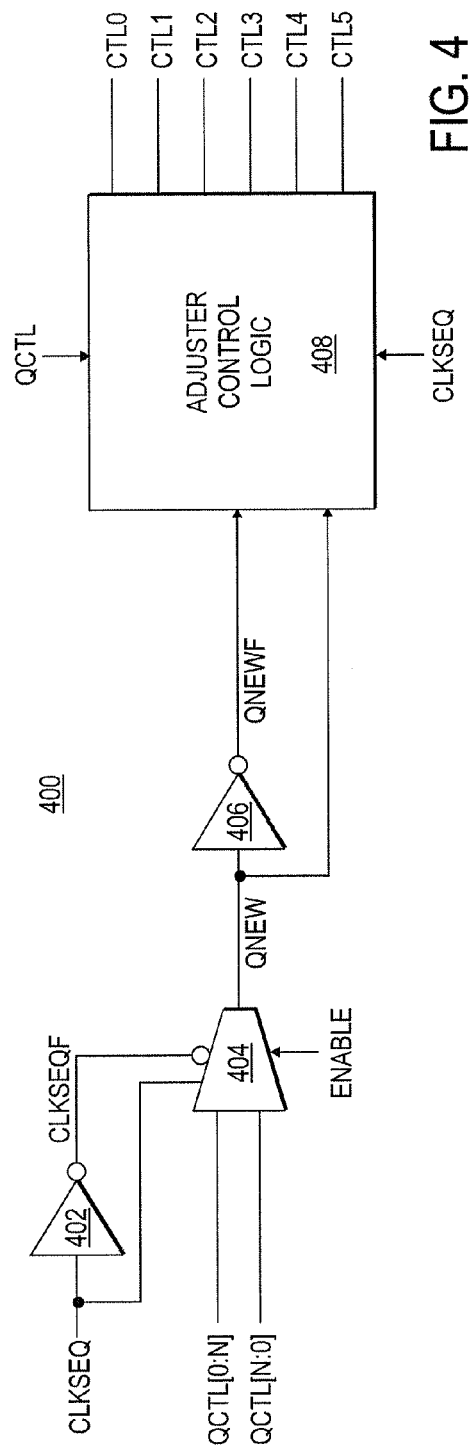
FIG. 4 is a schematic block diagram of a duty cycle adjuster control circuit according to an embodiment of the present invention.

FIG. 4 is a schematic block diagram of a duty cycle adjuster control circuit 400 according to an embodiment of the present invention. The duty cycle adjuster control circuit 400 may be used to implement the duty cycle adjuster control 310 of FIG. 3. The duty cycle adjuster control circuit 400 may include inverters 402, 406, multiplexer 404, and adjuster control logic 408.

The multiplexer 404 may be configured to receive the control word QCTL and provide the control word QCTL as a control word QNEW. In at least one embodiment, the multiplexer 404 may be configured to receive QCTL in a first bit order (e.g., [0:N]) and QCTL in a second bit order (e.g., [N:0]), and selectively provide the first or second bit order of the control word QCTL based, at least in part, on the CLKSEQ clock sequence signal and/or its complement, CLKSEQF. In other embodiments, the multiplexer 404 may be configured to receive a first portion of the control word QCTL (e.g., [0:3]) and a second portion of the control word QCTL (e.g., [4:N]) and selectively provide the first portion or the second portion based, at least in part, on the CLKSEQ clock sequence signal and/or its complement, CLKSEQF. As described, the clock sequence signal CLKSEQ may indicate which of the clock signals EVEN, ODD is leading. Thus, the bit order or portion selectively provided by the multiplexer 404 may be based, at least in part, on which of the clock signals EVEN, ODD is leading. The multiplexer 404 may further be configured to provide the control word QNEW responsive, at least in part, to an asserted ENABLE control signal. For example, the multiplexer 404 may provide the control word QNEW responsive to the ENABLE control signal having a first state (e.g., asserted), and place its output in a HI-Z (high impedance) state responsive to the ENABLE control signal having a second state.

The control word QNEW may be provided to the inverter 406 and inverted by the inverter 406 to provide a control word QNEWF. The adjuster control logic 408 may be configured to receive the control words QNEW, QNEWF and provide the plurality of control signals CTL based, at least in part, on the control words QNEW, QNEWF. The adjuster control logic 408 may be configured to provide any number of control signals CTL. For instance, as illustrated, the adjuster control logic may provide 6 controls signals based on the control words QNEW, QNEWF, CTL0-CTL5. In other examples, fewer or greater numbers of control signals CTL may be provided. The adjuster control logic 408 may be configured to provide the plurality of control words CTL to a duty cycle adjuster, such as the duty cycle adjuster 320 of FIG. 3. The adjuster control logic 408 may include analog and/or digital circuits. For example, the adjuster control logic 408 may be configured to provide the plurality of control words CTL using a bias voltage generator.

Figure 5:
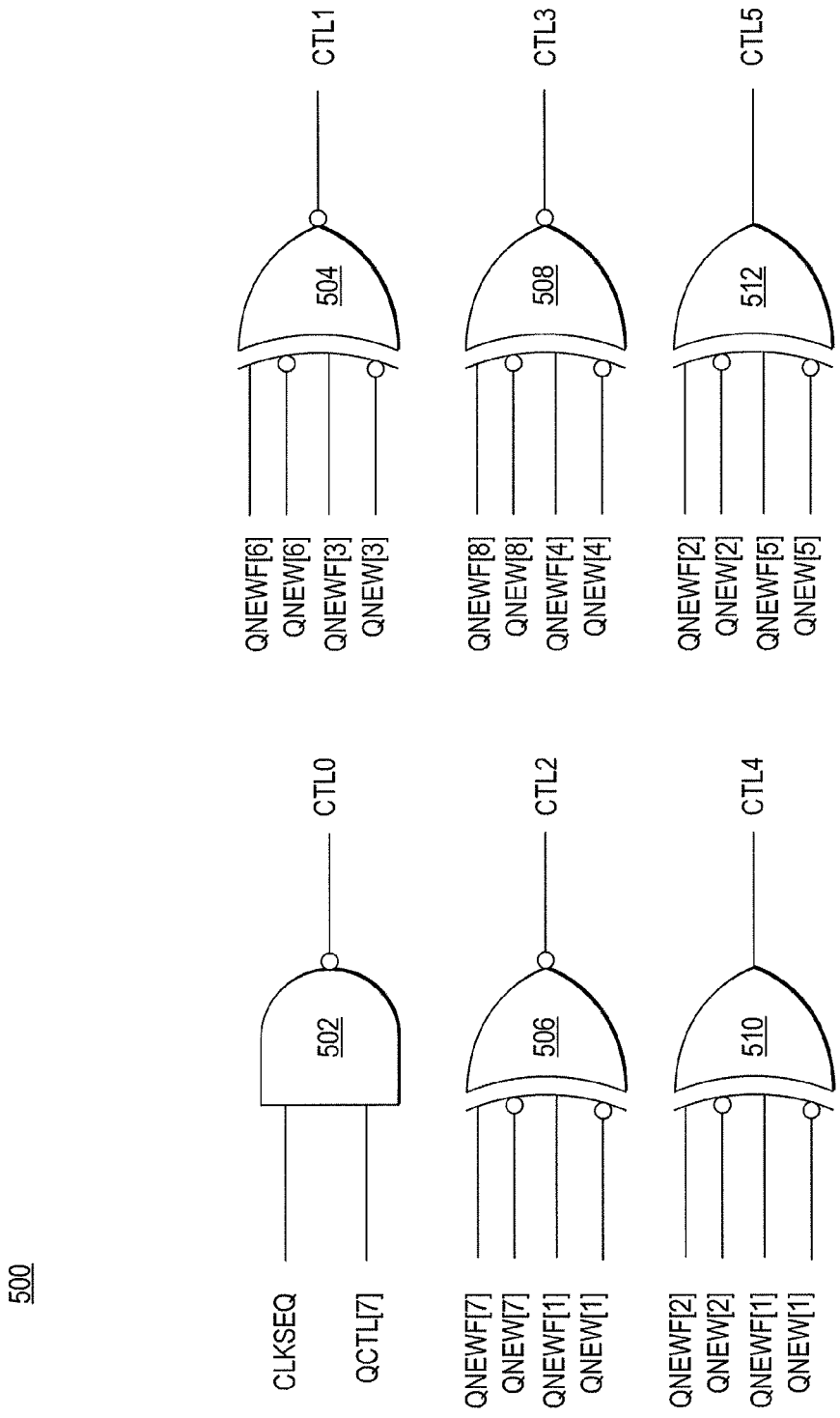
FIG. 5 is a schematic diagram of adjuster control logic according to an embodiment of the present invention.

FIG. 5 is a schematic diagram of adjuster control logic 500 according to an embodiment of the present invention. The adjuster control logic 500 may be used to implement the adjuster control logic 408 of FIG. 4. The adjuster control logic 500 may include logic gates 502-512.

The NAND gate 502 may be configured to receive the CLKSEQ clock sequence signal and a respective bit of the QCTL control word (e.g., QCTL[7]) and provide the control signal CTL0.

The XNOR gate 504 may be configured to receive respective bits of the control word QNEW (e.g., QNEW[3], QNEW[6]) and respective bits of the control word QNEWF (e.g., QNEWF[3], QNEWF[6]) and provide the control signal CTL1. In at least one embodiment, the XNOR gate 504 may be configured to inverse the respective bits of the control word QNEW at respective inputs.

The XNOR gate 506 may be configured to receive respective bits of the control word QNEW (e.g., QNEW[1], QNEW[7]) and respective bits of the control word QNEWF (e.g., QNEWF[1], QNEWF[7]) and provide the control signal CTL2. In at least one embodiment, the XNOR gate 506 may be configured to inverse the respective bits of the control word QNEW at respective inputs.

The XNOR gate 508 may be configured to receive respective bits of the control word QNEW (e.g., QNEW[4], QNEW[8]) and respective bits of the control word QNEWF (e.g., QNEWF[4], QNEWF[8]) and provide the control signal CTL3. In at least one embodiment, the XNOR gate 508 may be configured to inverse the respective bits of the control word QNEW at respective inputs.

The XNOR gate 510 may be configured to receive respective bits of the control word QNEW (e.g., QNEW[1], QNEW[2]) and respective bits of the control word QNEWF (e.g., QNEWF[1], QNEWF[2]) and provide the control signal CTL4. In at least one embodiment, the XNOR gate 510 may be configured to inverse the respective bits of the control word QNEW at respective inputs.

The XNOR gate 512 may be configured to receive respective bits of the control word QNEW (e.g., QNEW[2], QNEW[5]) and respective bits of the control word QNEWF (e.g., QNEWF[2], QNEWF[5]) and provide the control signal CTL5. In at least one embodiment, the XNOR gate 512 may be configured to inverse the respective bits of the control word QNEW at respective inputs.

As previously described, the control signals CTL0-CTL5 may be provided to a duty cycle adjuster (e.g., duty cycle adjuster 320 of FIG. 3) for generating a DCOUT output signal.

Figure 6:
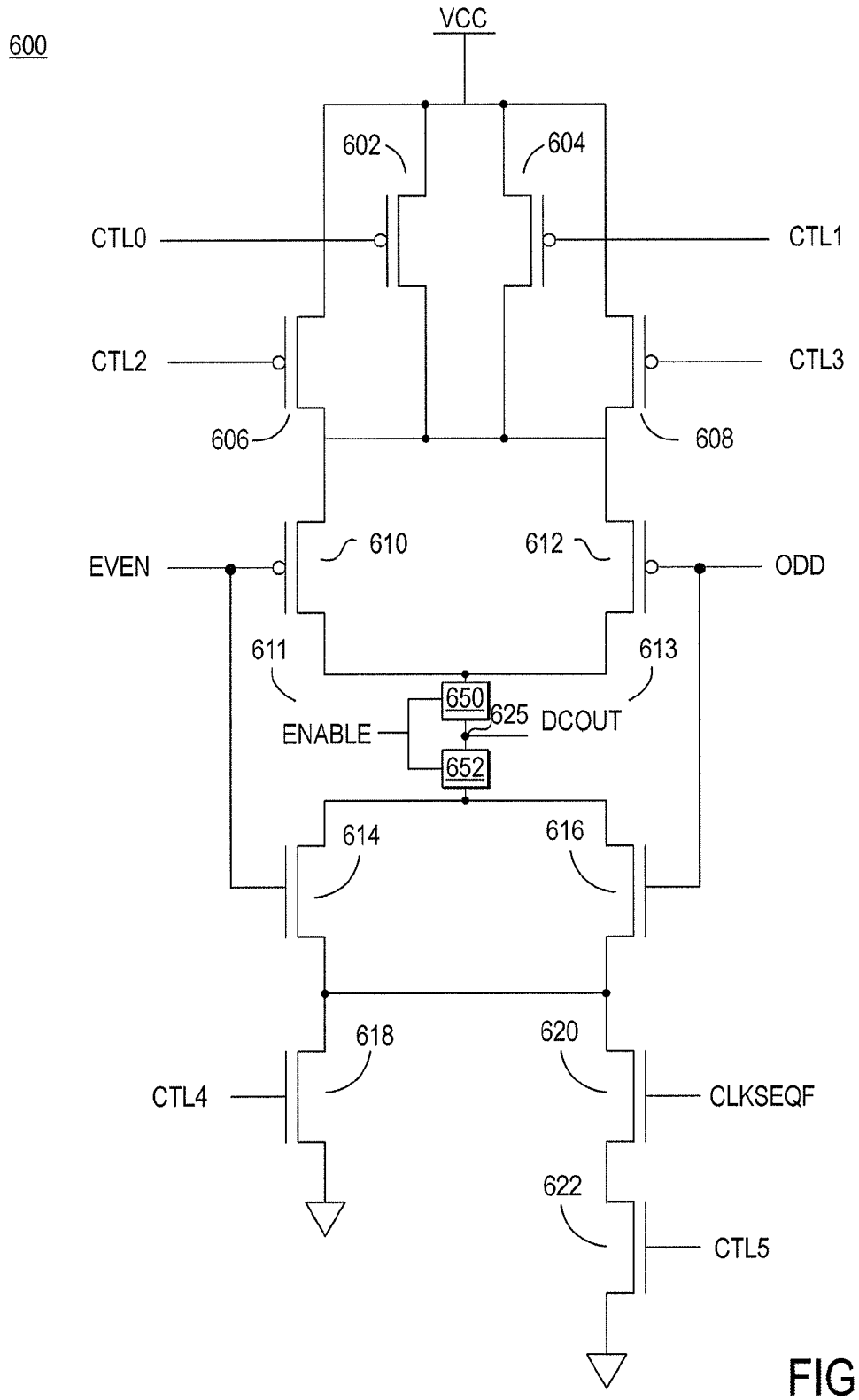
FIG. 6 is a schematic diagram of a duty cycle adjuster according to an embodiment of the present invention.

FIG. 6 is a schematic diagram of a duty cycle adjuster 600 according to an embodiment of the present invention. The duty cycle adjuster 600 may be used to implement the duty cycle adjuster 320 of FIG. 3 and may include a plurality of transistors 602-622 and switches 650, 652.

The duty cycle adjuster 600 may include inverters 611, 613, comprising transistors 610, 614, and 612, 616, respectively. The inverters 611, 613, may be configured to receive and invert the EVEN clock signal and ODD clock signal, respectively, and further may be configured to provide inverted EVEN, ODD clock signals to a node 625 via switches 650, 652 to provide the DCOUT output signal. The switches 650, 652 may comprise any switch known in the art, including one or solid state (e.g., transistor) and/or mechanical switches (e.g., single throw switch), and may be responsive to the control signal ENABLE. For example, responsive to the ENABLE control signal having a first state, the switches 650, 652 may couple the node 625 to the inverters 611, 613. Responsive to the ENABLE control signal having a second state, the switches 650, 652 may provide a HI-Z output and/or decouple the node 6254 from the inverters 611, 613. In other examples, the duty cycle adjuster 600 may not include switches 650, 652 such that the inverters 611, 613 may be coupled directly to the node 625.

Transistors 602, 604, 606, 608, 618, and 622 may be configured to receive a respective one of the plurality of control signals CTL. For example, the transistor 602 may receive the control signal CTL0, the transistor 604 may receive the control signal CTL1, the transistor 606 may receive the control signal CTL2, the transistor 608 may receive the control signal CTL3, the transistor 618 may receive the control signal CTL4, and the transistor 622 may receive the control signal CTL5. The transistor 620 may receive CLKSEQF. The plurality of control signals CTL0-CTL5 and CLKSEQF may be provided to respective transistors 602, 604, 606, 608, 618, 622, and 620 of the duty cycle adjuster 600 to adjust the manner in which the inverted EVEN and ODD clock signals are provided to the node 625 by the inverters 611, 613. In one embodiment, for example, control signals may be provided to adjust the pull-up and/or pull-down strength of the inverters 611, 613. For example, the control signals CTL0-CTL3 may be used to adjust the pull-up strength by controlling the activation of the transistors 602, 604, 606, and 608, and the control signals CTL4, CTL5, and CLKSEQF may be used to adjust the pull-down strength by controlling the activation of the transistors 618, 622, and 620.

As described, the duty cycle adjuster 600 may be configured to receive the plurality of control signals CTL from an adjuster control logic, such as the adjuster control logic 408 of FIG. 4 and further may receive the control signal ENABLE. In some examples, when the control signal ENABLE has a first state (e.g., logic low), the plurality of control signals CTL may be provided such that each of the transistors 602, 604, 606, 608, 618, 622, and 620 is disabled. For example, control signals CTL0-CTL3 may be held in a logic low state and control signals CTL4-CTL5 may be held in a logic high state.

When the control signal ENABLE has a second state (e.g., logic high), the plurality of control signals CTL may be provided such that the duty cycle adjuster 600 may operate to provide DCOUT as described herein. As previously described, duty cycle adjuster circuits described herein, such as the duty cycle adjuster circuit 110 of FIG. 1, may be configured to provide a DCOUT output signal having duty cycle variation matched to the duty cycle variation of a PMOUT output signal provided by a phase mixer, such as the phase mixer 120 of FIG. 1. In this manner, DCOUT may be combined with PMOUT to provide a CLKOUT output signal having relatively low duty cycle variation.

Figure 7:
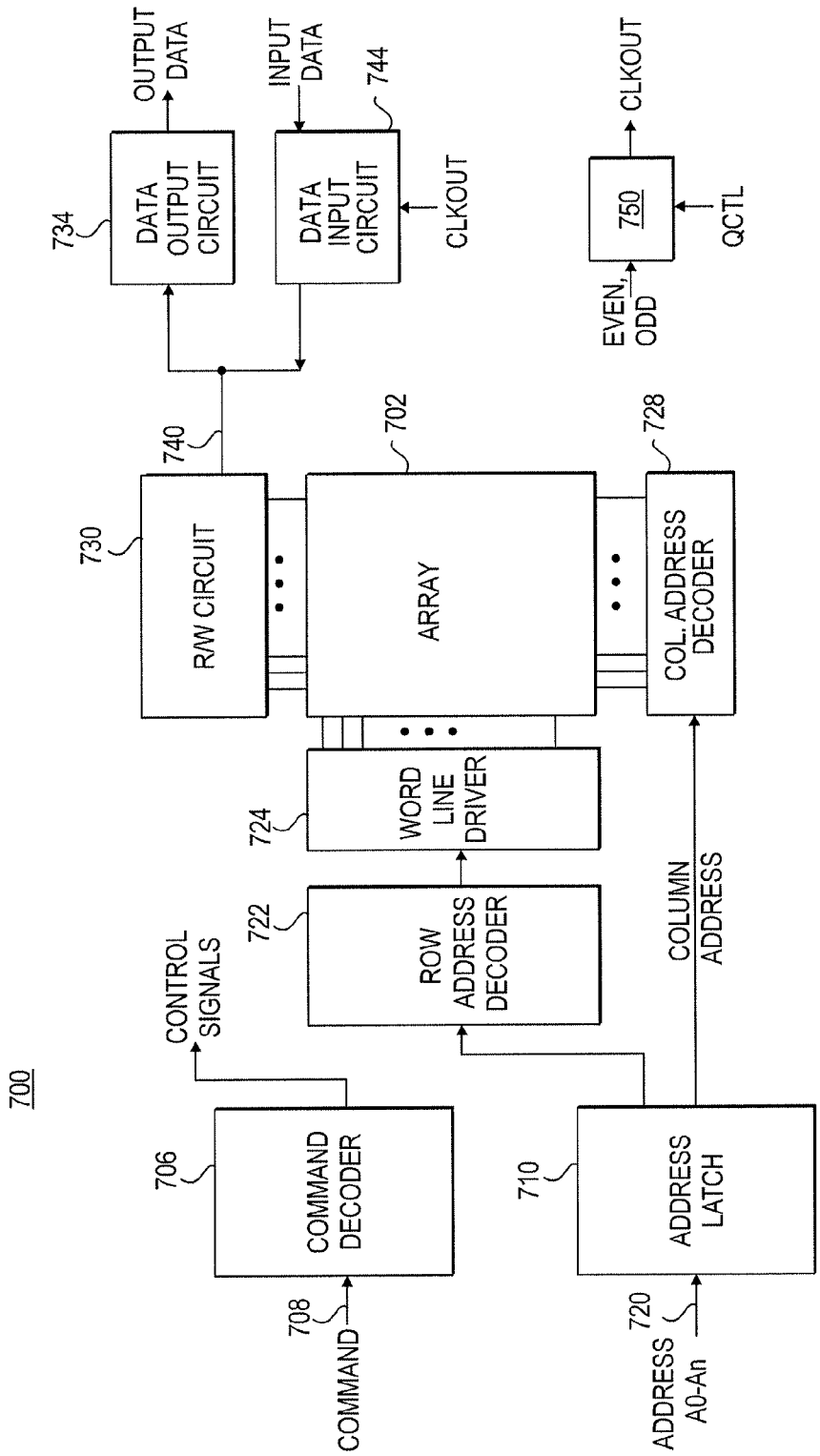
FIG. 7 is a block diagram of a portion of a memory including an apparatus according to an embodiment of the present invention.

FIG. 7 illustrates a portion of a memory 700 according to an embodiment of the present invention. The memory 700 includes an array 702 of memory cells, which may be, for example, volatile memory cells, non-volatile memory cells, DRAM memory cells, SRAM memory cells, flash memory cells, or some other types of memory cells. The memory 700 includes a command decoder 706 that receives memory commands and addresses through an ADDR/CMD bus. The command decoder 706 provides control signals, based on the commands received through the ADDR/CMD bus. The command decoder 706 also provides row and column addresses to the memory 700 through an address bus and an address latch 710. The address latch then outputs separate column addresses and separate row addresses.

The row and column addresses are provided by the address latch 710 to a row address decoder 722 and a column address decoder 728, respectively. The column address decoder 728 selects bit lines extending through the array 702 corresponding to respective column addresses. The row address decoder 722 is connected to word line driver 724 that activates respective rows of memory cells in the array 702 corresponding to received row addresses. The selected data line (e.g., a bit line or bit lines) corresponding to a received column address are coupled to a read/write circuitry 730 to provide read data to a data output circuit 734 via an input-output data bus 740. Write data are provided to the array 702 through a data input circuit 744 and the memory array read/write circuitry 730. The command decoder 706 responds to memory commands and addresses provided to the ADDR/CMD bus to perform various operations on the array 702. In particular, the command decoder 706 is used to provide control signals to read data from and write data to the array 702.

The memory 700 may include one or more apparatuses 750 that may be implemented using one or more apparatuses described herein, such as the apparatus 100 of FIG. 1. As described, the apparatus 750 may be configured to receive clock signals EVEN, ODD and a control word QCTL, and to provide a CLKOUT output signal having a relatively constant duty based, at least in part, on the EVEN, ODD clock signals and the control word QCTL.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a phase mixer having a first step duty cycle response and configured to provide a first output signal having a first duty cycle variation in accordance with the first step duty cycle response; and
a duty cycle adjuster circuit having a second step duty cycle response and configured to provide a second output signal in accordance with the second step duty cycle response, wherein an output clock signal based on the combination of the first and second output signals has a second duty cycle variation less than the first duty cycle variation,
wherein the phase mixer is further configured to provide the first output signal based, at least in part, on a control word.

2. The apparatus of claim 1, wherein the first step duty cycle response is non-linear.

3. The apparatus of claim 1, wherein the second step duty cycle response is complementary to the first step duty cycle response.

4. The apparatus of claim 1, wherein the duty cycle adjuster comprises:
a duty cycle adjuster control circuit configured to receive the control word and provide a plurality of control signals based, at least in part, the control word,
wherein the second output signal is based, at least in part, on the plurality of control signals.

5. The apparatus of claim 1, wherein the duty cycle adjuster is further configured to provide the second output signal responsive, at least in part, to assertion of an enable signal.

6. The apparatus of claim 5, wherein the enable signal is asserted responsive, at least in part, to duty cycle variation of the first output signal exceeding a threshold.

7. The apparatus of claim 1, wherein the apparatus is included in a memory.

8. An apparatus, comprising:
a phase mixer configured to provide an output signal having a first duty cycle variation;
a duty cycle adjuster control circuit configured to receive a control word, the duty cycle adjuster control circuit configured to provide a plurality of control signals based, at least in part, on the control word; and
a duty cycle adjuster configured to receive the plurality of control signals, the duty cycle adjuster further configured to provide an output signal based, at least in part, the plurality of control signals,
wherein the output signal has a second duty cycle variation different than the first duty cycle variation.

9. The apparatus of claim 8, wherein the duty cycle adjuster control circuit comprises:
a multiplexer;
first and second inverters coupled to the multiplexer; and
adjuster control logic coupled to the second inverter and configured to receive the control word from the second inverter and provide the plurality of control signals based, at least in part, on the control word.

10. The apparatus of claim 8, wherein the duty cycle adjuster control circuit is configured to provide each of the plurality of control signals using a respective logic gate.

11. The apparatus of claim 8, wherein a duty cycle adjuster control circuit configured to receive a control word comprises a duty cycle adjuster configured to receive a control word having a first bit order and receive the control word having a second bit order.

12. The apparatus of claim 8, wherein the duty cycle adjuster is further configured to provide the plurality of control signals based, at least in part, on a clock sequence signal.

13. The apparatus of claim 8, wherein the first and second duty cycle variations are complementary.

14. The apparatus of claim 8, wherein the duty cycle adjuster is configured to provide the output signal responsive to being enabled and to place an output of the duty cycle adjuster in a high impedance state responsive, at least in part, to being not enabled.

15. The apparatus of claim 8, wherein the duty cycle adjuster comprises:
   first and second inverters; and
   a first transistor coupled to the first and second inverters and configured to receive a first control signal of the plurality of control signals and adjust a pull-up strength of the first and second inverters responsive to the first control signal; and
   a second transistor coupled to the first and second inverters and configured to receive a second control signal of the plurality of control signals and adjust a pull-down strength of the first and second inverters responsive to the second control signal.

16. An apparatus, comprising:
   a phase mixer configured to provide a first output signal having a first duty cycle variation, the first output signal based, at least in part, on first and second clock signals, wherein the phase mixer is configured to mix the first and second clock signals based, at least in part, on a control word to provide the first output signal; and
   a duty cycle adjuster circuit configured to provide a second output signal having a second duty cycle variation, the second output signal based, at least in part, on the first and second clock signals,
   wherein the second duty cycle variation is complementary to the first duty cycle variation.

17. The apparatus of claim 16, wherein at least one of the first and second duty cycle variations is non-linear.

18. The apparatus of claim 16, wherein the duty cycle adjuster circuit is further configured to provide the second output signal based, at least in part, on a clock sequence signal, the clock sequence signal indicating which of the first and second clock signals is leading.

19. The apparatus of claim 16, wherein the duty cycle adjuster circuit is configured to adjust a phase of the second output signal based, at least in part, on the control word.

20. A method, comprising:
   providing a second output signal having a second duty cycle variation based, at least in part, on a control word;
   combining a first output signal having a first duty cycle variation with the second output signal having the second duty cycle variation to provide an output dock signal, wherein combining the second output signal and the first output signal reduces the first duty cycle variation.

21. The method of claim 20, wherein providing the second output signal having the second duty cycle variation comprises:
   providing a plurality of control signals based, at least in part, on the control word; and
   providing the second output signal based, at least in part, on the plurality of control signals.

22. The method of claim 21, wherein providing the second output signal based, at least in part, on the plurality of control signals comprises:
   adjusting a drive strength of an inverter responsive to the plurality of control signals.

23. The method of claim 21, wherein providing the second output signal based, at least in part, on the plurality of control signals comprises:
   adjusting a phase of the second output signal responsive to the plurality of control signals.

24. The method of claim 20, further comprising providing the second output signal having the second duty cycle variation, wherein providing the second output signal having the second duty cycle variation comprises:
   providing the second output signal responsive to an enable signal having a first state; and
   placing an output in a high impedance state responsive to the enable signal having a second state.

25. A method, comprising:
   receiving first and second clock signals and a control word;
   providing, a first signal in accordance with a first step duty cycle response based, at least in part on the first and second clock signals and the control word;
   providing a second signal in accordance with a second step duty cycle response different than the first step duty cycle response based, at least in part on the first and second clock signals and the control word; and
   combining the first and second signal at a node to provide an output signal.

26. The method of claim 25, wherein providing a second signal in accordance with a second step duty cycle response different than the first step duty cycle response based, at least, in part on the first and second clock signals and the control word comprises selecting one of a plurality of bit orders of the control word.

27. The method of claim 25, wherein providing a second signal in accordance with a second step duty cycle response different than the first step duty cycle response comprises providing a second signal in accordance with a second step duty cycle response complementary to the first step duty cycle response.

28. An apparatus, comprising:
   a phase mixer configured to provide a first output signal having a first duty cycle variation, the first output signal based, at least in part, on first and second clock signals; and
   a duty cycle adjuster circuit configured to provide a second output signal having a second duty cycle variation, the second output signal based, at least in part, on the first and second clock signals,
   wherein the second duty cycle variation is complementary to the first duty cycle variation and wherein at least one of the first and second duty cycle variations is non-linear.

* * * * *

UNITED STATES PATENT AND TRADEMARK OFFICE
CERTIFICATE OF CORRECTION

PATENT NO. : 8,947,144 B2
APPLICATION NO. : 13/920852
DATED : February 3, 2015
INVENTOR(S) : Yantao Ma Page 1 of 1

It is certified that error appears in the above-identified patent and that said Letters Patent is hereby corrected as shown below:

In the Claims

In column 9, line 42, in Claim 20, delete "dock" and insert -- clock --, therefor.

In column 10, line 19, in Claim 25, delete "providing," and insert -- providing --, therefor.

In column 10, line 31, in Claim 26, delete "least," and insert -- least --, therefor.

Signed and Sealed this
Fifth Day of May, 2015

Michelle K. Lee
*Director of the United States Patent and Trademark Office*